US009929209B2

(12) United States Patent
Herget et al.

(10) Patent No.: US 9,929,209 B2
(45) Date of Patent: Mar. 27, 2018

(54) MAGNETIC MULTILAYER STRUCTURE

(71) Applicant: International Business Machines Corporation, Armonk, NY (US)

(72) Inventors: Philipp Herget, San Jose, CA (US); Eugene J. O'Sullivan, Nyack, NY (US); Lubomyr T. Romankiw, Briarcliff Manor, NY (US); Naigang Wang, Ossining, NY (US); Bucknell C. Webb, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/414,997

(22) Filed: Jan. 25, 2017

(65) Prior Publication Data

US 2017/0200766 A1    Jul. 13, 2017

Related U.S. Application Data

(62) Division of application No. 15/156,576, filed on May 17, 2016, now Pat. No. 9,601,484, which is a division
(Continued)

(51) Int. Cl.
| | |
|---|---|
| *H01L 43/12* | (2006.01) |
| *H01L 27/22* | (2006.01) |
| *H01F 27/28* | (2006.01) |
| *H01F 27/24* | (2006.01) |
| *H01F 1/147* | (2006.01) |
| *H01F 10/14* | (2006.01) |
| *H01L 49/02* | (2006.01) |

(Continued)

(52) U.S. Cl.
CPC ......... *H01L 27/22* (2013.01); *H01F 1/14708* (2013.01); *H01F 10/14* (2013.01); *H01F 27/24* (2013.01); *H01F 27/2804* (2013.01); *H01L 28/10* (2013.01); *H01L 43/02* (2013.01); *H01L 43/10* (2013.01); *H01L 43/12* (2013.01); *H01F 2027/2809* (2013.01)

(58) Field of Classification Search
CPC ......... H01L 27/22; H01L 43/12; H01L 43/02; H01L 43/10
See application file for complete search history.

(56) References Cited

U.S. PATENT DOCUMENTS 7,380,328 B2    6/2008 Ahn et al.
7,755,124 B2    7/2010 Fajardo et al.
(Continued)

FOREIGN PATENT DOCUMENTS

JP    10079305 A    3/1998

OTHER PUBLICATIONS

V. Soare, et al., "Electrodeposition and Characterization of CuInSe2/CdS Multilayered Thin Films Deposited on Flexible Substrate," Optoelectronics and Advanced Materials—Rapid Communications vol. 4, No. 12, Dec. 2010, p. 2018-2021.

*Primary Examiner* — Douglas Menz
(74) *Attorney, Agent, or Firm* — Cantor Colburn LLP; Louis Percello

(57) ABSTRACT

A mechanism is provided for an integrated laminated magnetic device. A substrate and a multilayer stack structure form the device. The multilayer stack structure includes alternating magnetic layers and diode structures formed on the substrate. Each magnetic layer in the multilayer stack structure is separated from another magnetic layer in the multilayer stack structure by a diode structure.

20 Claims, 15 Drawing Sheets

Related U.S. Application Data of application No. 14/155,552, filed on Jan. 15, 2014, now Pat. No. 9,384,879.

(51) Int. Cl.
*H01L 43/02* (2006.01)
*H01L 43/10* (2006.01)

(56) References Cited

U.S. PATENT DOCUMENTS

| | | |
|---|---|---|
| 8,263,239 B2 | 9/2012 | Berger et al. |
| 8,339,802 B2 | 12/2012 | Lotfi et al. |
| 8,754,500 B2 | 6/2014 | Webb |
| 9,305,578 B1 | 4/2016 | Singleton et al. |
| 2009/0046501 A1 | 2/2009 | Ranjan et al. |
| 2012/0248570 A1 | 10/2012 | Golubovic et al. |

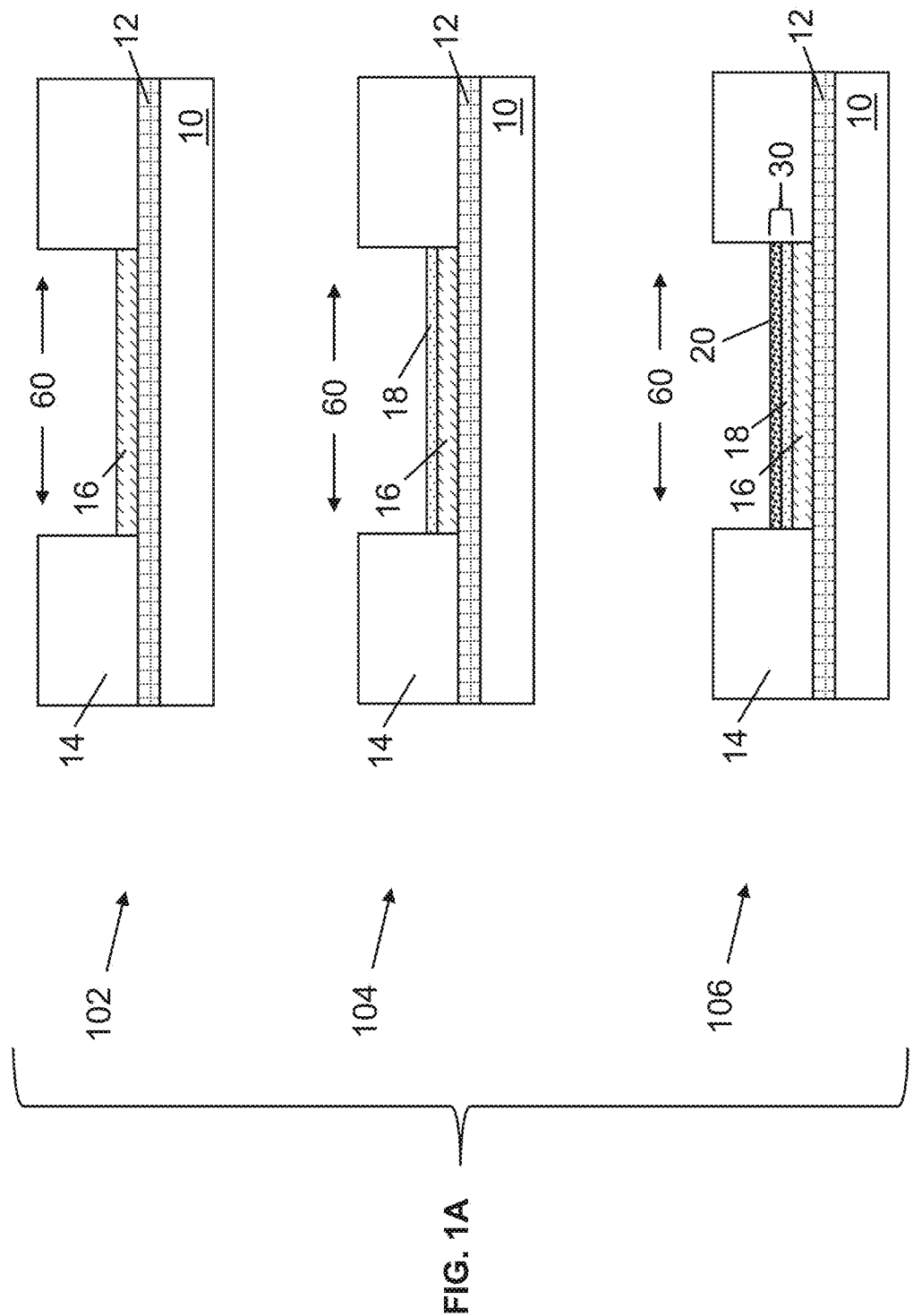

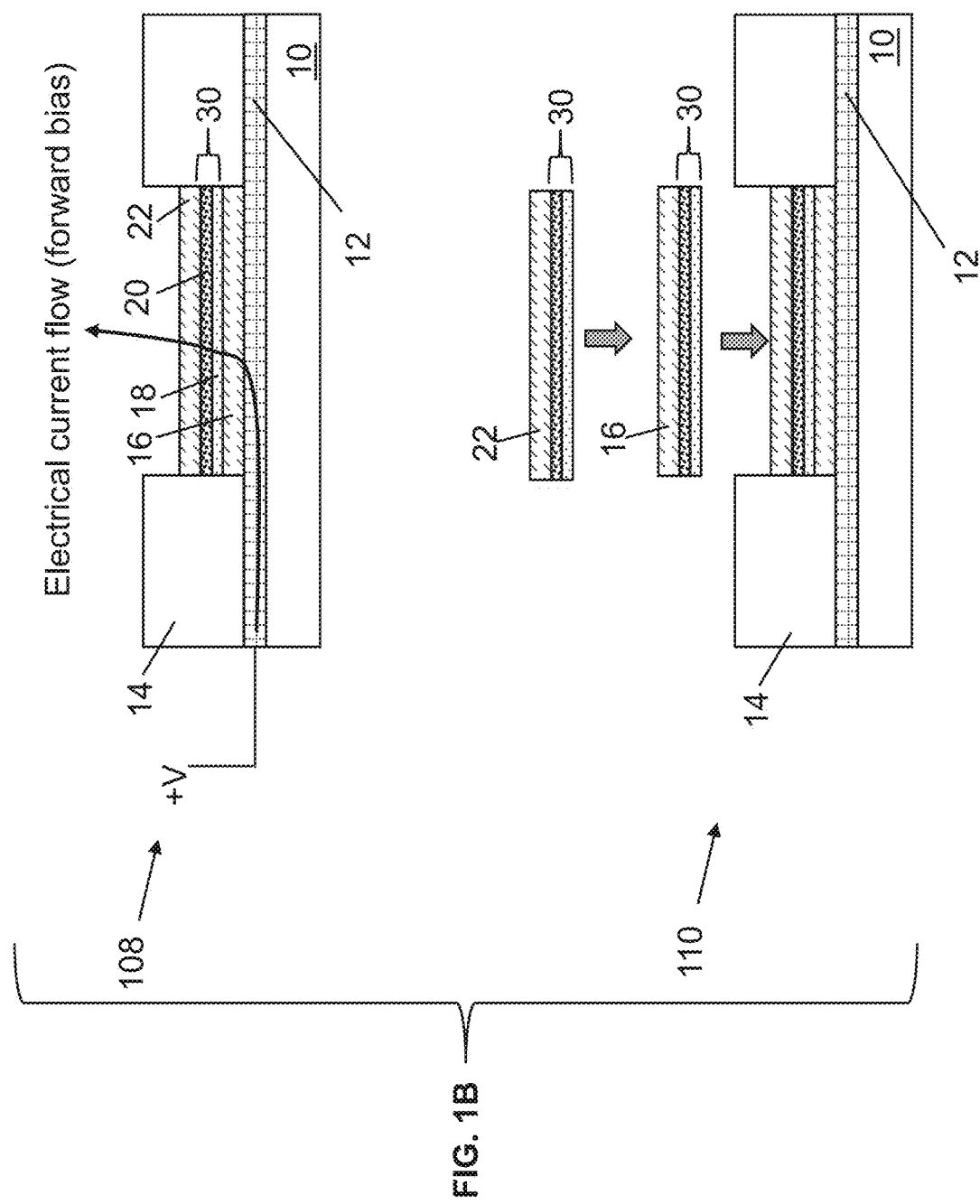

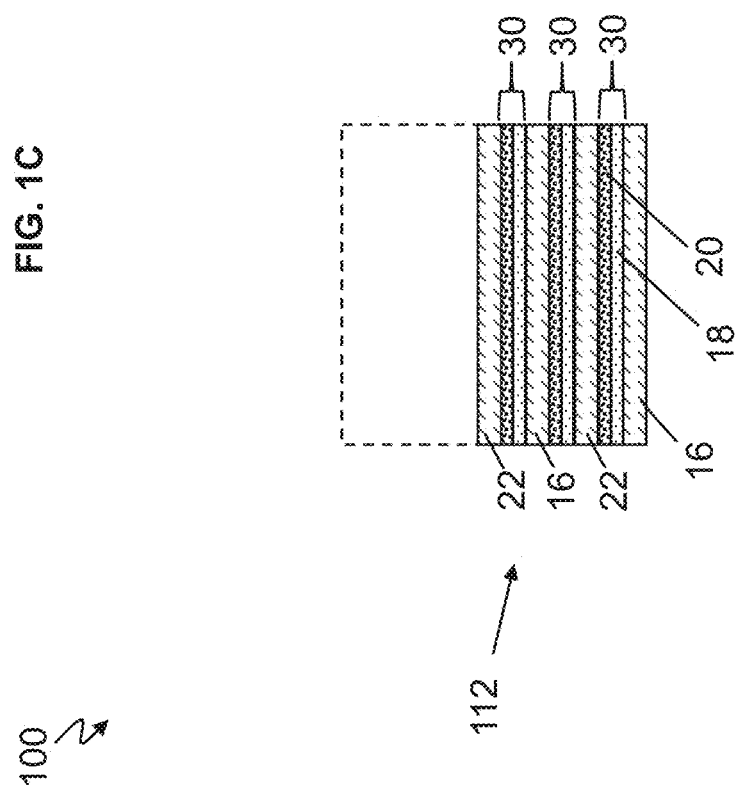

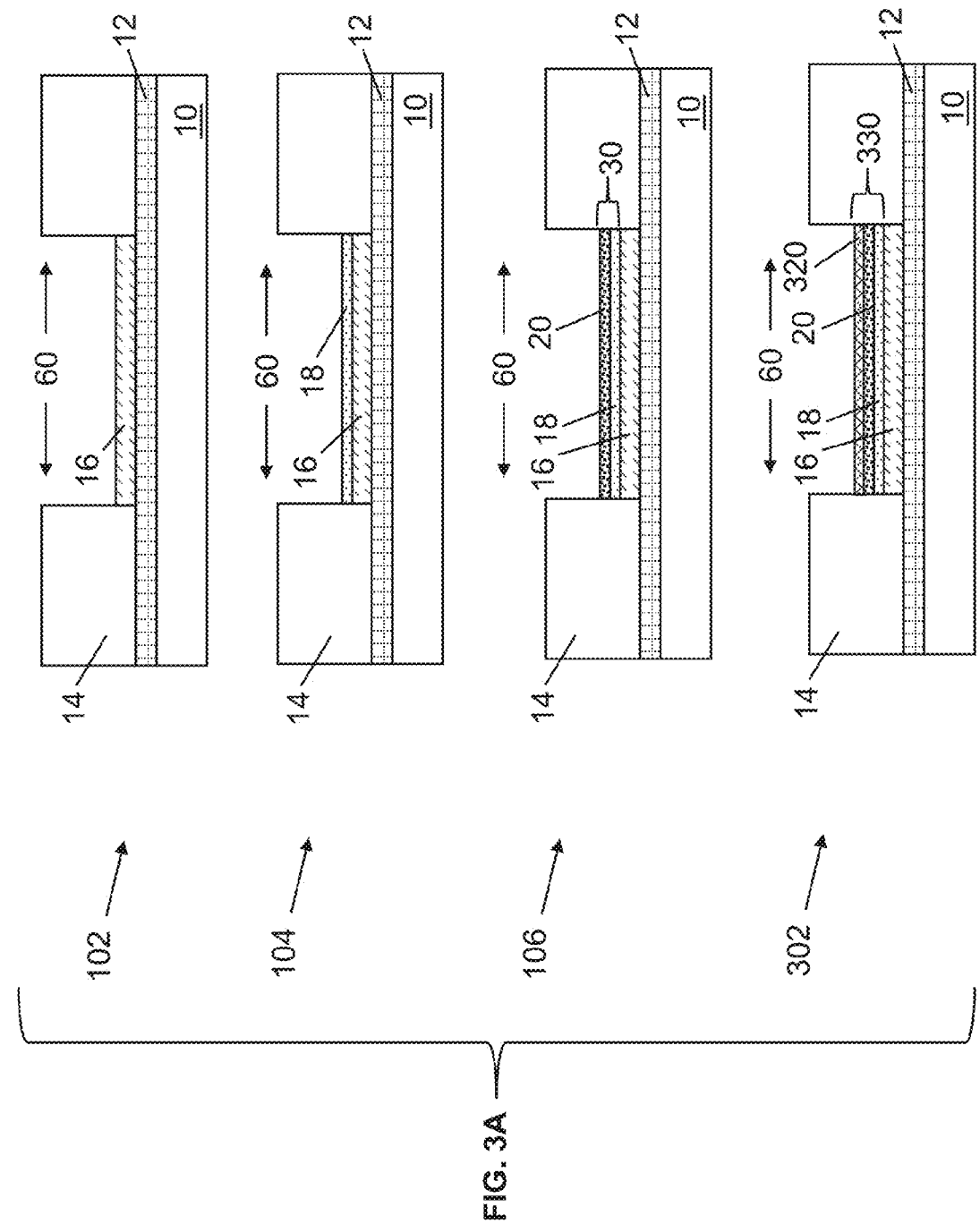

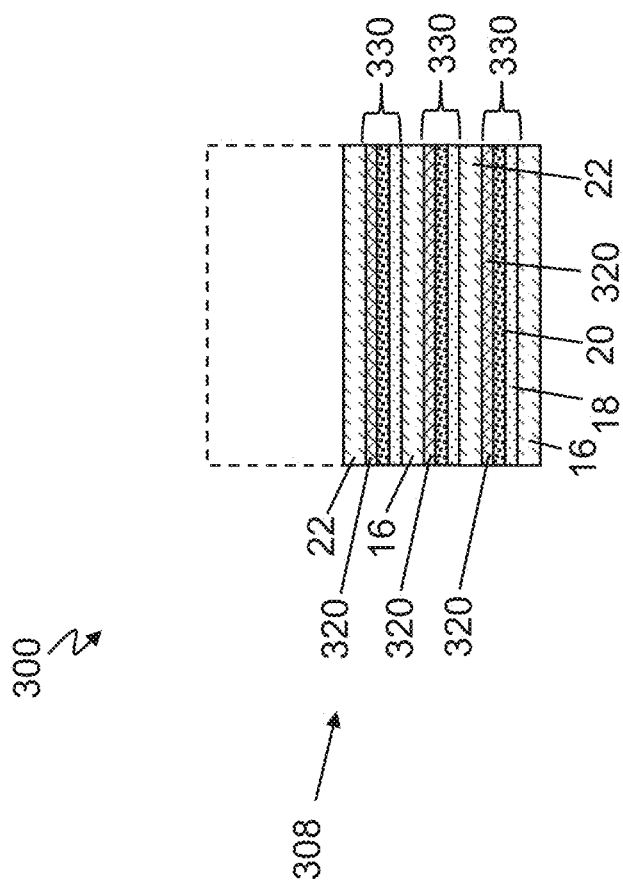

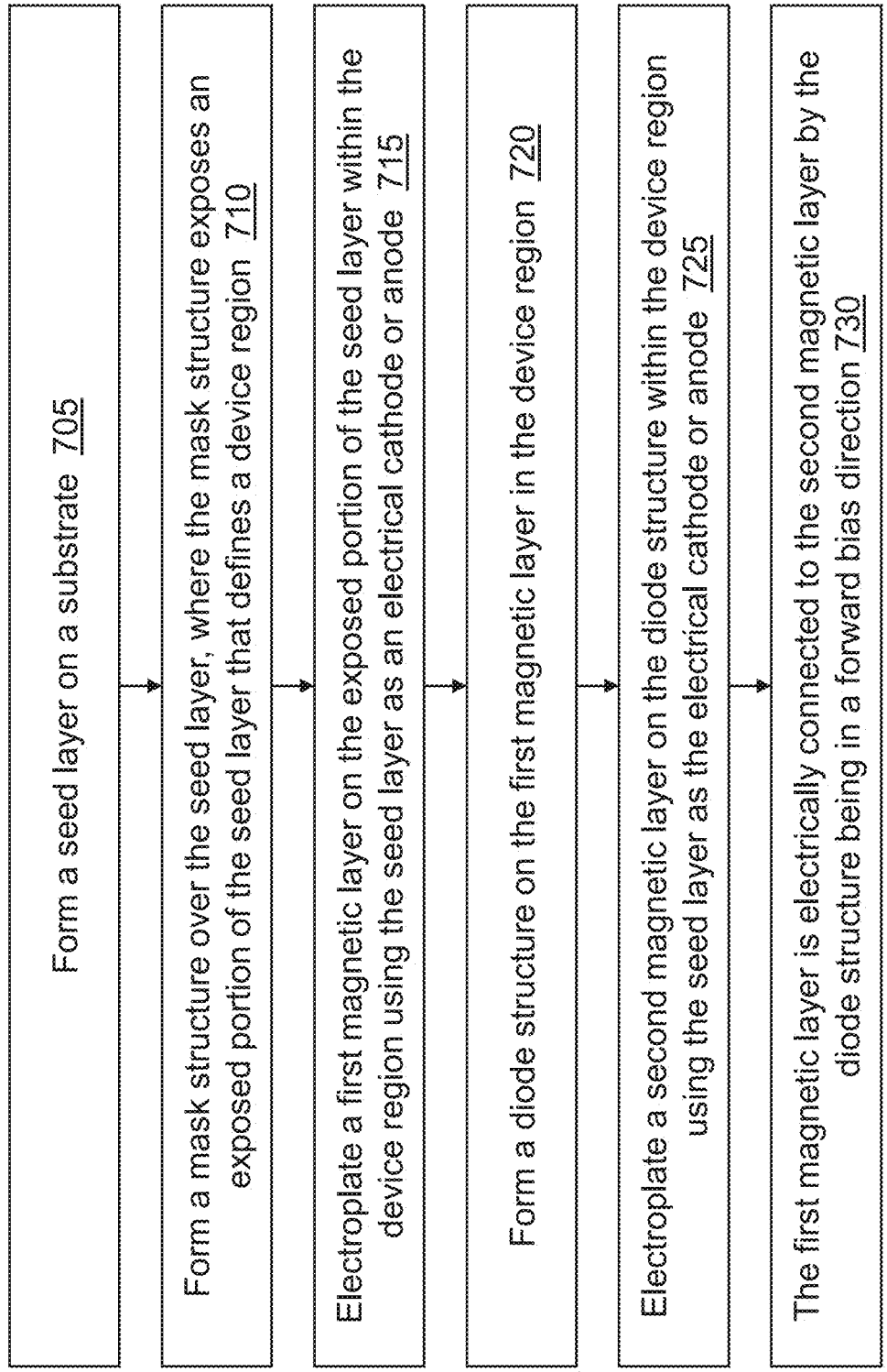

MAGNETIC MULTILAYER STRUCTURE

DOMESTIC PRIORITY

This application is a divisional of and claims priority from U.S. patent application Ser. No. 15/156,576, filed on May 17, 2016, entitled "MAGNETIC MULTILAYER STRUCTURE" which is a divisional of U.S. patent application Ser. No. 14/155,552, filed on Jan. 15, 2014, entitled "MAGNETIC MULTILAYER STRUCTURE", the entire contents of which are incorporated herein by reference.

GOVERNMENT RIGHTS

This invention was made with Government support under Contract No. DE-EE0002892 awarded by the Department of Energy. The Government has certain rights in this invention.

BACKGROUND

The present invention relates generally to semiconductor integrated magnetic devices, and more specifically, to laminated magnetic diode stack structures formed using electroplating techniques.

When constructing a semiconductor integrated magnetic device using a magnetic film, it is desirable to make the magnetic film sufficiently thick to obtain desirable operating characteristics for a given frequency of operation. However, the thickness of a single magnetic layer that is required for a given operating frequency of the magnetic device may result in the build-up of eddy currents in the magnetic material during operation, thereby resulting in some loss. As such, the magnetic film is typically made sufficiently thin to avoid eddy current losses, but with the tradeoff of lower energy storage ability.

The energy storage of an integrated magnetic device can be increased, however, by building a magnetic structure using a stack of alternating thin magnetic and insulating films, wherein the magnetic layers are separated by a thin insulating layer. In general, the use of multiple layers of magnetic material separated by layers of insulating material serves to prevent the build-up of eddy currents in the magnetic material, while providing an effective thickness of magnetic material, which is sufficient to obtain the desired operating characteristics for a given frequency of operation.

Conventional techniques for building multilayer magnetic-insulator structures include sputtering techniques. In general, a sputtering process includes forming a multilayer stack by alternately sputtering layers of a magnetic material and a dielectric material, patterning a photoresist layer to form an etch mask, using the etch mask to etch the multilayer stack of magnetic-insulating layers and remove unwanted regions of the multilayer stack, and then removing the etch mask. While sputtering can be used to build stacks of magnetic-insulating layers, the material and manufacturing costs for sputtering are high.

SUMMARY

According to an exemplary embodiment, an integrated laminated magnetic device is provided. The device includes a substrate and a multilayer stack structure which includes alternating magnetic layers and diode structures formed on the substrate. Each magnetic layer in the multilayer stack structure is separated from another magnetic layer in the multilayer stack structure by a diode structure.

According to another exemplary embodiment, a method for fabricating an integrated laminated magnetic device is provided. The method includes providing a substrate and forming a multilayer stack structure on the substrate. The multilayer stack structure includes alternating magnetic layers and diode structures formed on the substrate. Each magnetic layer in the multilayer stack structure is separated from another magnetic layer in the multilayer stack structure by a diode structure.

According to another exemplary embodiment, a method for fabricating an integrated laminated magnetic device is provided. The method includes forming a seed layer on a substrate and forming a mask structure over the seed layer in which the mask structure exposes an exposed portion of the seed layer that defines a device region. The method includes electroplating a first magnetic layer on the exposed portion of the seed layer within the device region using the seed layer as an electrical cathode or anode, forming a diode structure on the first magnetic layer in the device region, and electroplating a second magnetic layer on the diode structure within the device region using the seed layer as the electrical cathode or anode. The first magnetic layer is electrically connected to the second magnetic layer by the diode structure being in a forward bias direction, and a combination of the first magnetic layer, the diode structure, and the second magnetic layer form a sandwich.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A through 1C illustrate a fabrication process for a magnetic multilayer structure according to an embodiment, in which:

FIG. 1A illustrates cross-sectional views of fabricating the magnetic multilayer structure according to an embodiment.

FIG. 1B illustrates cross-sectional views of forward biasing the magnetic multilayer structure and repeating fabrication processes to form additional layers according to an embodiment.

FIG. 1C illustrates a cross-sectional view of the magnetic multilayer structure according to an embodiment.

FIGS. 3A, 3B, and 3C illustrate a fabrication process for a magnetic multilayer structure according to an embodiment, in which:

FIG. 3A illustrates cross-sectional views of fabricating the magnetic multilayer structure with a top diode layer according to an embodiment.

FIG. 3B illustrates cross-sectional views of forward biasing the magnetic multilayer structure and repeating fabrication processes to form additional layers according to an embodiment.

FIG. 3C illustrates a cross-sectional view of the magnetic multilayer structure according to an embodiment.

FIGS. 4A, 4B, and 4C illustrate a fabrication for a multilayer magnetic structure according to an embodiment, in which:

FIG. 4A illustrates cross-sectional views of fabricating the magnetic multilayer structure with a barrier layer according to an embodiment.

FIG. 4B illustrates cross-sectional views of forward biasing the multilayer magnetic structure and forming the top diode layer according to an embodiment.

FIG. 4C illustrates cross-sectional views of repeating fabrication processes to form additional layers and of the multilayer magnetic structure according to an embodiment.

FIGS. 5A, 5B, and 5C illustrate a fabrication for a multilayer magnetic structure according to an embodiment, in which:

FIG. 5A illustrates cross-sectional views of fabricating the magnetic multilayer structure according to an embodiment.

FIG. 5B illustrates cross-sectional views of forward biasing the magnetic multilayer structure according to an embodiment.

FIG. 5C illustrate cross-sectional views of repeating fabrication processes to form additional layers and the magnetic multilayer structure according to an embodiment.

FIG. 7 illustrates a method for fabricating an integrated laminated magnetic device according to an embodiment.

DETAILED DESCRIPTION

Figure 2A:
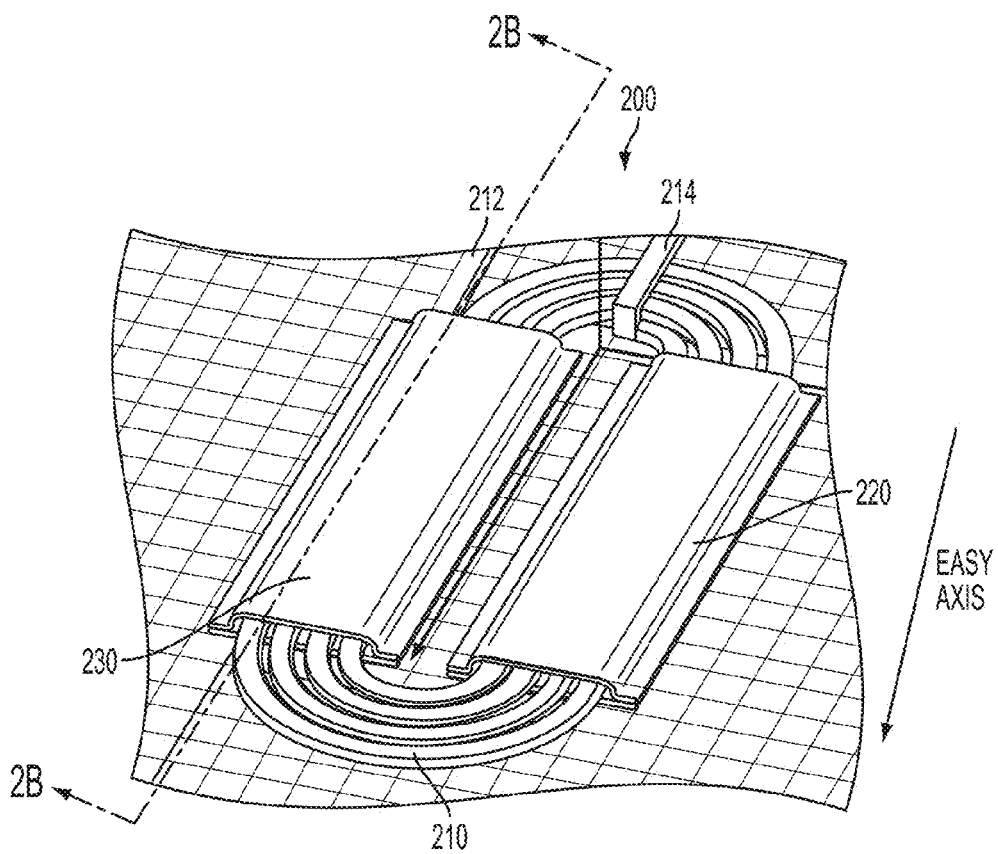
FIG. 2A illustrates an operation concept utilizing magnetic multilayer structure with diode structures according to an embodiment.

Embodiments of the invention disclose techniques to fabricate laminate magnetic layers with diodes interposed between. The multilayer stack of magnetic layers and diodes can be utilized in semiconductor integrated magnetic devices such as inductors, transformers, etc., which include laminated magnetic-diode stack structures that are formed using electroplating techniques (and/or in combination with other deposition techniques such as sputtering).

With standard electroplating techniques, each magnetic layer in a multilayer stack of magnetic-insulating layers may be as follows. A first step involves depositing a conducting seed layer over the entire wafer via a vacuum deposition process, e.g., sputtering. Optionally, an insulator may be deposited over the wafer prior to depositing the conducting seed layer. Next, a layer of photoresist material is deposited on the conducting seed layer, and the photoresist material is patterned photolithographically to form a photoresist mask that covers portions of the seed layer where plating of magnetic material is unwanted. Subsequently, an electrical connection is made to the seed layer (and electrolyte solution in the tank), and an electroplating process is performed to electroplate a layer of magnetic material (NiFe, compounds of Ni/Fe/Co, Co—W—P, etc.) onto the portions of the seed layer that are exposed through the photoresist mask. After the electroplating process is performed, the photoresist mask is removed and the residual seed layer (portions of seed layer that were covered by the photoresist mask) is removed by reactive-ion etching (RIE) or some other suitable etching process. Thereafter, an insulating layer is formed over the electroplated magnetic layer.

The electroplating process is then repeated for each additional layer of magnetic material that is deposited to form the multilayer stack of magnetic-insulating layers. In particular, after each insulating layer is formed, the process steps of seed layer deposition, resist and mask alignment, resist patterning, electroplating, resist strip, and seed layer removal are independently performed for each layer of the magnetic stack structure. This process repetition can be expensive and cumbersome when the number of magnetic layers forming a stack is large. Moreover, this process can also cause alignment problems between the magnetic layers.

In accordance with embodiments, the electroplating process can be simplified by eliminating the repeated steps of: depositing and patterning a photoresist pattern, removing the photoresist pattern, adding insulating material, and etching away the seed layer for each layer of deposition of the magnetic material, and performing the same steps again. In general, an electroplating process according to embodiments involves using only one patterning mask (that does not have to be removed for subsequent layers), and then sequentially forming the magnetic layers and subsequent diode structures into the multilayer magnetic stack so that each intervening diode structure electrically isolates the magnetic layers in the reverse bias direction while only allowing electrical current to flow in the forward bias direction (e.g., in an upward direction as depicted in the figures).

The diode structures are formed in between each of the magnetic layers in the multilayer magnetic stack structure. By forward biasing the diode structures in the same direction, electrical current is only allowed to flow in a single direction (e.g., forward bias direction) and eddy currents are blocked from flowing in the reverse direction. This is because no electrical current (i.e., eddy current) flows in the reverse bias direction for the diode structures, each of which is individually sandwiched between every two magnetic layers. Various techniques may be used to construct the multilayer magnetic structures with diode structures interposed between the magnetic layers. The various techniques of embodiments may be combined as understood by one skilled in the art.

Now turning to the figures, FIGS. 1A, 1B, and 1C (generally referred to as FIG. 1) illustrate a schematic to fabricate a magnetic multilayer structure 100 according to an embodiment. FIGS. 1A through 1C are cross-sectional views of the schematic to form the magnetic multilayer structure 100.

FIGS. 1A through 1C (along with figures below) discuss electroplating techniques for depositing layers. As understood by one skilled in the art, electroplating is a process that uses electrical current to reduce dissolved metal cations so that they form a coherent metal coating on an electrode. The process used in electroplating is called electrodeposition. The part to be plated is the cathode of the circuit. In one technique, the anode is made of the metal to be plated on the part. Both components are immersed in a solution called an electrolyte containing one or more dissolved metal salts as well as other ions that permit the flow of electricity. A power supply supplies a direct current to the anode, oxidizing the metal atoms that comprise anode and allowing the metal atoms to dissolve in the electrolyte solution. At the cathode, the dissolved metal ions in the electrolyte solution are reduced at the interface between the solution and the cathode, such that they "plate out" onto the cathode. The rate at which the anode is dissolved is equal to the rate at which the cathode is plated, vis-à-vis the current flowing through the circuit. In this manner, the ions in the electrolyte bath are continuously replenished by the anode. Other electroplating processes may use a non-consumable anode such as platinum or carbon. In these techniques, ions of the metal to be plated must be periodically replenished in the electrolyte bath as they are drawn out of the solution.

Referring to FIG. 1A, a substrate 10 (such as a silicon wafer) has a seed layer 12 deposited in preparation for electroplating (also referred to as plating) in view 102. The seed layer 12 may be selected to correspond to a first magnetic layer 16 (discussed below). The seed layer 12 may be deposited by any known deposition technique as understood by one skilled in the art. For example, the seed layer 12 may be deposited by sputtering, evaporation or CVD.

A photoresist 14 is deposited (via any known deposition technique) and patterned on the seed layer 12 in preparation for electrodepositing subsequent layers during electroplating. The resist 14 is patterned to create a device region 60 for plating the layers in subsequent views. Various operations of the electroplating process are discussed below.

The first magnetic layer 16 of magnetic material is deposited on the seed layer 12 by electroplating. The thickness of the first magnetic layer 16 may range from 0.3 micrometers (μm) to 1.3 μm. Examples of the magnetic material of the first magnetic layer 16 may include NiFe, CoWB, Fe, CoFeB, CoWP, CoP, NiFeCo, etc.

In a case where the first magnetic layer 16 is NiFe, the composition may be (approximately) 80% Ni and 20% Fe, the magnetic permeability of NiFe is 500 to 1000 H/m (where H is the magnetic field strength and m represents meter), and the resistivity of NiFe is 20 μ·Ω·cm (microOhm·centimeter).

In another case when the first magnetic layer 16 is NiFe, the composition may be 45% Ni and 55% Fe, the magnetic permeability of NiFe is 200 to 700 H/m, and the resistivity of NiFe is 40 μ·Ω·cm.

In the case when the first magnetic layer 16 is CoWB, the composition may be mostly Co (e.g., 75, 85, and/or 90% Co, with the remaining material as W and P), the relative magnetic permeability of CoWP is 100 to 1000, and the resistivity of CoWP is about 100 μ·Ω·cm.

In view 104, a first diode layer 18 is deposited on the first magnetic layer 16 in the device region 60 by electroplating. In view 106, a second diode layer 20 is deposited on the first diode layer 18 in the device region 60 by electroplating, thus forming the diode structure 30. The first diode layer 18 may be a p-type material (having more positive charge carriers) and the second diode layer 20 may be an n-type material (having more negative charge carriers) such that the diode structure 30 is forward biased in the upward direction (e.g., from first diode layer 18 to second diode layer 20) and reverse biased in the downward direction (e.g., from second diode layer 20 to first diode layer 18). The forward bias of the diode structure 30 (and subsequent diode structures 30 formed in the multilayer magnetic structure 100) only allow electrical current to flow upward thus blocking eddy current from flowing downward as discussed herein.

Examples (p-type) materials of the first diode layer 18 may include Bi, Se, doped Si, doped Ge, doped (Cu,Ga) CdS or CdSe, and CuInSe$_2$. The thicknesses of the diode layer 18 may range from 20 nanometers (nm) to 1000 nm. Example (n-type) materials of the second diode layer 20 may include (doped and/or updoped), Ge, Si, CdS, and CdSe. The thicknesses of the second diode layer 20 may range from 20 nm to 1000 μm. To electroplate the first diode layer 18, ions of the p-type material are dissolved in electrolyte bath (solution). Voltage is applied to the seed layer 12 and to the electrolyte bath to plate the p-type material of the first diode layer 18. As a low cost example, the electroplating of a selenium rectifier cell can be utilized for diode layers 18 and 20. Selenium, as a p-type semiconductor, can form Schottky barrier or herterojunction with n-type materials (e.g. Se/CdS). For the electroplating of Se layer, an example electrolyte composition is (0.1-1)[mole]H$_2$SeO$_3$; (10-250)× 10$^{-3}$ [mole] alkane sulfonic acid with plating current density between 0.5-5 mA/cm$^2$ at a PH of 3-4, where mA is milliamperes and cm$^2$ is square centimeters.

CdS thin films in turn can be deposited from a chemical bath containing citratocadmium(II) and thiourea as described in "Mechanism of Chemical Bath Deposition of Cadmium Sulfide Thin Films in the Ammonia-Thiourea System In Situ Kinetic Study and Modelization" by Raúl Ortega-Borges and Daniel Lincot, Journal of Electrochemical Society 1993 140(12): 3464-3473, which is herein incorporated by reference. The diode (e.g., diode structure 30, 330) as deposited has sufficient carriers but can be n-doped with by annealing in N$_2$ or by plating of an In layer and subsequent annealing at 250 C. Since the required CdS layer can be as thin as 10 nm (although 50 nm is more robust), the CdS can also be vacuum deposited as a simpler alternative.

The photoconductivity of the diode can be used to help initiate plating of the next magnetic layer onto the diode but becomes irrelevant once the magnetic layer is thick enough to be opaque.

To electroplate the second diode layer 20, ions of the p-type material are dissolved in electrolyte bath (solution). Voltage is applied to the seed layer 12 and to the electrolyte bath to plate the n-type material of the second diode layer 20.

In FIG. 1B, a second magnetic layer 22 is deposited on the second diode layer 20 in the device region 60 via electroplating. As noted above for the first magnetic layer 16, the thickness of the second magnetic layer 22 may range from 0.3 μm to 1.3 μm. Examples of the magnetic material of the second magnetic layer 22 may include NiFe, CoWP, Fe, CoFeB, etc. In a case when the second magnetic layer 22 is NiFe, the composition may be (approximately) 80% Ni and 20% Fe, the magnetic permeability of NiFe is 500 to 1000 H/m (where H is the magnetic field strength and m represents meter), and the resistivity of NiFe is 20 μ·Ω·cm (microOhm·centimeter). In another case when the second magnetic layer 22 is NiFe, the composition may be 45% Ni and 55% Fe, the magnetic permeability of NiFe is 200 to 700 H/m, and the resistivity of NiFe is 40 μ·Ω·cm. In the case when the second magnetic layer 22 is CoWP, the composition may be mostly Co (e.g., 75, 85, and/or 90% Co, with the remaining magnetic material as W and P), the relative magnetic permeability of CoWP is 100 to 1000 H/m, and the resistivity of CoWP is 100 μ·Ω·cm.

As seen in FIG. 1B, the diode structure 30 is in forward bias when voltage (+V) is applied and the electrical current flows upward through the first magnetic layer 16, through first diode layer 18, through second diode layer 20, through second magnetic layer 22, and into subsequent layers, but not in the reverse direction.

View 110 illustrates electroplating additional layers to form the magnetic stack with the desired layers all in forward bias. FIG. 1C illustrates the multilayer magnetic structure 100 with the desired number of layers formed in the magnetic stack in view 112. The dashed lines represent additional number of layers deposited utilizing the fabrication operations discussed herein. The first magnetic layer 16 and the second magnetic layer 22 may be the same magnetic material. To electroplate the layers in FIG. 1, the multilayer magnetic structure 100 may be moved from one tank of electrolyte solution to another tank of different electrolyte solution until the multilayer magnetic structure 100 is formed. For example, there may be one tank of electrolyte solution for depositing the first magnetic layer 16, one tank of electrolyte solution for depositing the first diode layer 18, one tank of electrolyte solution for depositing the second diode layer 20, and another tank (or the same for the first magnetic layer 16) of electrolyte solution for depositing the second magnetic layer 22. Then, the electroplating process repeats to form additional layers as shown in view 110. The multilayer magnetic structure 100 is annealed to form the diode structures 30. The multilayer magnetic structure 100 may be annealed at 220° C. (Celsius).

The photoresist 14 (patterned mask), the seed layer 12, and the substrate 10 are stripped off once the multilayer magnetic structure 100 (including multilayer magnetic structures 300 and 400 discussed herein) is completed. When depositing the various layers, the seed layer 12 does not have to be repeatedly deposited. Similarly, the photoresist 14 does not have to be repeatedly deposited, patterned, and etched in order to deposit additional layers. In other words, a single photoresist 14 and single seed layer 12 may be utilized throughout the fabrication operations.

FIG. 2A illustrates a schematic of an operation concept utilizing diode structures disclosed herein according to an embodiment. FIG. 2A is a schematic perspective view of a semiconductor integrated magnetic device 200 having multilayer magnetic stack structures (such as multilayer magnetic structures 100, 300, 400) according to an embodiment. The integrated magnetic device 200 is a semiconductor integrated planar inductor device that comprises a planar multi-turn coil structure 210 having an input port 212 and an output port 214. The integrated magnetic device 200 further comprises a plurality of magnetic structures 220 and 230 that surround portions of the coil structure 210 along the "easy axis" of the integrated magnetic device 200. Each magnetic structure 220 and 230 may be referred to as a yoke. Each magnetic structure 220 and 230 is a multilayer magnetic structure (i.e., multilayer magnetic structures 100, 300, 400) comprising a plurality of sequentially formed layers of magnetic materials and diode materials (as discussed herein). In particular, the magnetic structures 220 and 230 each comprise a lower stack structure that is formed on the substrate below the coil structure 210 and an upper stack structure that is formed above the coil structure 210. The lower and upper stack structures of the magnetic structures 220 and 230 serve to completely enclose the portions of the coil structure 210 along the easy axis region of the integrated device 200, thereby forming a closed loop of magnetic material that carries the magnetic flux fields generated by current flowing through the coil structure 210, and thereby providing a density of magnetic material that increases the storable energy density.

Figure 2B:
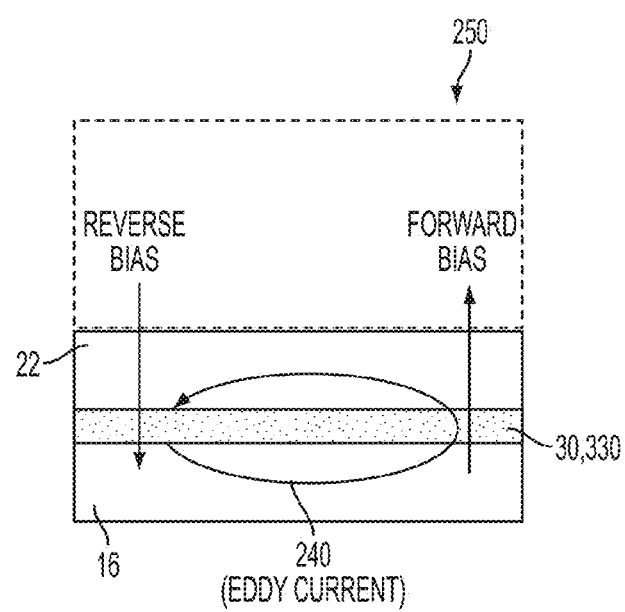
FIG. 2B illustrates a cross-sectional view of the magnetic multilayer structure according to an embodiment.

Embodiments discussed below illustrate how to form the magnetic structures 220 and 230 with diode structures 30 and 330 (diode structure 330 is introduced in FIG. 3). According to an embodiment, FIG. 2B illustrates a cross-sectional view of the integrated magnetic device 200 in which a breakout 250 is a cross-sectional view of a portion of the multilayer magnetic structure 230 (as well as multilayer magnetic structure 220). The breakout 250 is an enlarged view to illustrate the concept of utilizing the diode structures 30 and 330 to block eddy currents from flowing in the reverse bias direction. Note that the diode structures 30 and 330 are representative of the actual diode layers disclosed herein, and the breakout 250 is not intended to illustrate the actual diode layers (e.g., first diode layer, second diode layer, and optionally top diode layer) of the diode structures as these details are discussed herein. The breakout 250 shows the first magnetic layer 16 and the second magnetic layer 22 sandwiching the representative diode structure 30, 330. The dashed lines denote additional alternating layers of the multilayer magnetic structure 230 as discussed herein. The multilayer magnetic structure 230 (and 330) may be any one and/or a combination of the multilayer magnetic structures 100, 300, and 400 discussed herein in FIGS. 1 and 3-7.

A loop 240 denotes the electrical flow of eddy currents. In a conventional magnetic structure, the loop 240 would be closed. That is, eddy current would flow in a complete circuit around the loop 240.

However, in embodiments, the loop 240 is not a closed loop. For example, the alternating electrical current in and out of input port 212 and output port 214 of the coil structure 210 creates an alternating magnetic field. The voltage of the alternating current across the diode structure 30, 330 is utilized to forward bias the diode structure 30, 330. The diode structure 30, 330 in forward bias only allows the eddy current to flow in a single direction (e.g., upward), and thus the eddy current cannot complete the loop 240. By having multiple sandwiches of the first magnetic layer 16, the representative diode structure 30, 330, and the second magnetic layer 22, the multilayer magnetic structures 230, 330 are able to maintain the eddy current in a single upward direction. Since the breakout 250 shows the reverse bias direction is downward, the eddy current cannot flow down, thus breaking the complete electrical flow of eddy current around the loop 240.

The voltage across the diode is proportional to the cross-sectional area of the diode structure 30, 330, frequency of the magnetic field, and peak magnetic field. The following is an equation of the diode voltage:

$$\text{Voltage } V \text{ (of the diode)} = 2\pi \cdot A \cdot F \cdot B \quad \text{(Equation 1)}$$

In Equation 1, A is the area in square meters ($m^2$), F is the frequency of the magnetic field (in hertz (Hz)), and B is the B-magnetic field strength in Tesla (T). The following is an example to show that the diode structure 30, 330 is in forward bias. Assume that A=1000 μm·2 μm (width×height), F=1000 MHz, and B=1T. This results in a voltage across the diode of 0.6V.

Note that eddy currents are electric currents induced within conductors by a changing magnetic field in the conductor. These circulating eddies of current have inductance and thus induce magnetic fields. The stronger the applied magnetic field, the greater the electrical conductivity of the conductor, or the faster the field changes, then the greater the eddy currents that are developed and the greater the fields produced.

Although an example semiconductor integrated magnetic device 200 is discussed, embodiments also apply to other multilayer magnetic structures such as transformers with laminated steel cores.

Figure 3B:
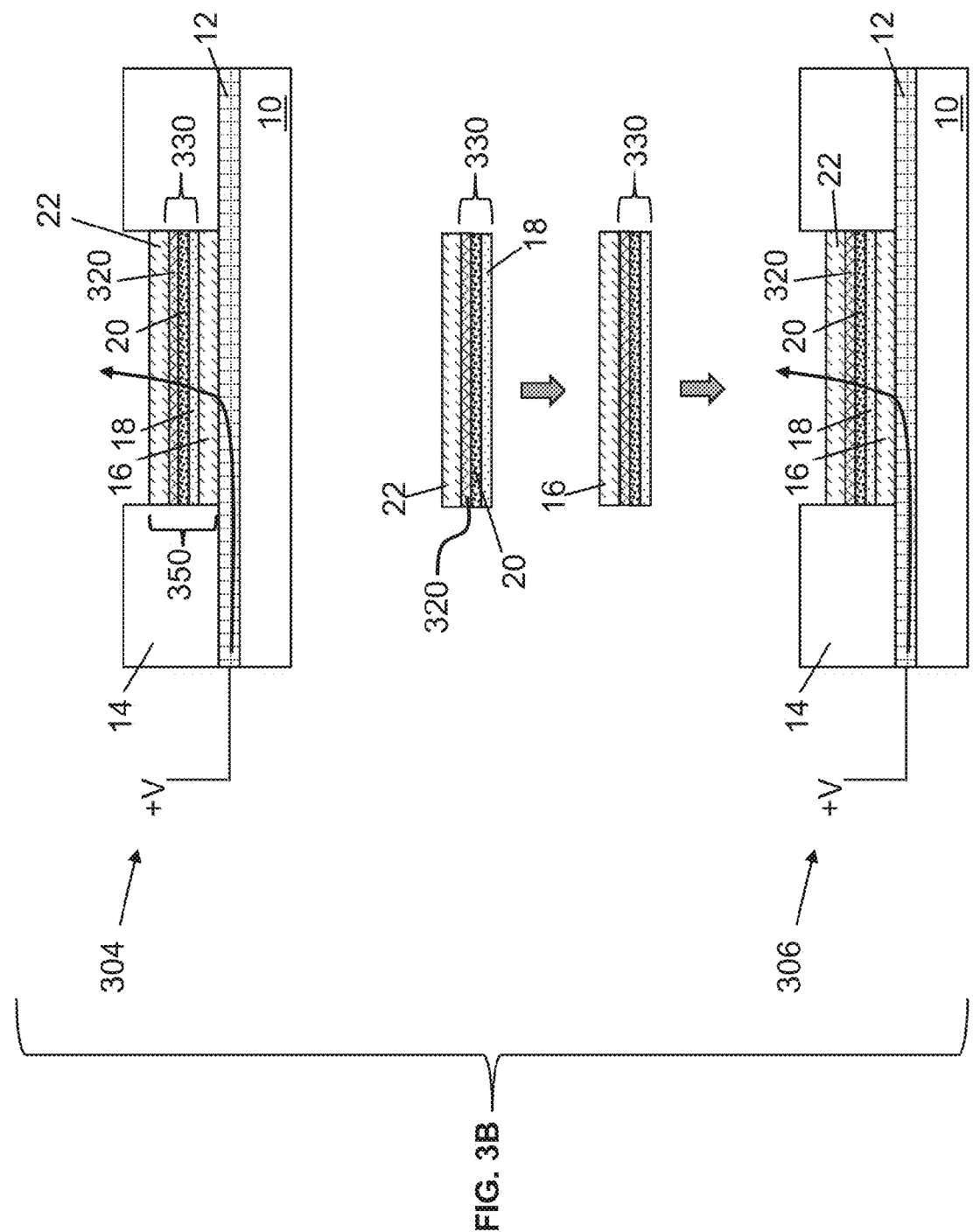

FIGS. 3A, 3B, and 3C (generally referred to as FIG. 3) illustrate a schematic to fabricate a magnetic multilayer structure 300 according to an embodiment. FIGS. 3A through 3C are cross-sectional views of the schematic to form the magnetic multilayer structure 300.

FIG. 3 incorporates fabrication processes discussed in FIG. 1, and adds an additional fabrication process for electrodepositing the top diode layer. The fabrication processes discussed in views 102, 104, and 106 of FIG. 1 apply in FIG. 3. Referring to FIG. 3A, the substrate 10 (such as a silicon wafer) has a seed layer 12 deposited in preparation for electroplating (also referred to as plating) in view 102. The seed layer 12 may be selected to correspond to a first magnetic layer 16. Also, as discussed above, the photoresist 14 is deposited and patterned on the seed layer 12 in preparation for electrodepositing subsequent layers during electroplating. The pattern of the resist 14 creates a device region 60 for plating the layers in subsequent views. Various operations of the electroplating process are discussed below.

In view 102, the first magnetic layer 16 of magnetic material is deposited on the seed layer 12 by electroplating. The thickness of the first magnetic layer 16 may range from 0.3 micrometers (μm) to 1.3 μm. Examples of the magnetic material of the first magnetic layer 16 may include NiFe, CoWP, Fe, CoFeB, etc.

In a case when the first magnetic layer 16 is NiFe, the composition may be (approximately) 80% Ni and 20% Fe, the magnetic permeability of NiFe is 500 to 1000 H/m, and the resistivity of NiFe is 20 μ·Ω·cm. In another case when the first magnetic layer 16 is NiFe, the composition may be 45% Ni and 55% Fe, the magnetic permeability of NiFe is 200 to 700 H/m, and the resistivity of NiFe is 40 μ·Ω·cm. In the case when the first magnetic layer 16 is CoWP, the composition may be mostly Co (e.g., 75, 85, and/or 90% Co, with the remaining magnetic material as W and P), the relative magnetic permeability of CoWP is 100 to 1000 H/m, and the resistivity of CoWP is 100 μ·Ω·cm.

In view 104, a first diode layer 18 is deposited on the first magnetic layer 16 in the device region 60 by electroplating. In view 106, a second diode layer 20 is deposited on the first diode layer 18 in the device region 60 by electroplating, thus forming the diode structure 30. The first diode layer 18 is a p-type material (having more positive charge carriers) and the second diode layer 20 is n-type material (having more negative charge carriers) such that the diode structure 30 is forward biased in the upward direction (e.g., from first diode layer 18 to second diode layer 20) and reverse biased in the downward direction (e.g., from second diode layer 20 to first diode layer 18). The forward bias of the diode structure 30 and subsequent diode structures 30 only allow electrical current to flow upward thus blocking eddy current from flowing downward as discussed herein.

As discussed above in FIG. 1, examples (p-type) materials of the first diode layer 18 may include Bi, doped Si, doped Ge, etc., and example (n-type) materials of the second diode layer 20 may include (doped and/or updoped) Se, Ge, Si, etc. To electroplate the first diode layer 18, ions of the p-type material are dissolved in electrolyte bath (solution). Then, voltage is applied to the seed layer 12 and to the electrolyte bath to plate the p-type material of the first diode layer 18. To electroplate the second diode layer 20, ions of the n-type material are dissolved in electrolyte bath (solution). Then, voltage is applied to the seed layer 12 and to the electrolyte bath to plate the n-type material of the second diode layer 20.

At this point, the fabrication process in view 302 differs from FIG. 1. In view 302, a top diode layer 320 is deposited on top of the second diode layer 20 in the device region 60 by electroplating. Plating the top diode layer 320 is an optional fabrication operation. The material of the top diode layer 320 may include Cu, Ag, Au, Ni, NiFe, Co, etc. To electroplate the top diode layer 320, an electrolyte solution (of ions) is prepared of at least one of the materials (Cu, Ag, Au, Ni, NiFe, Co, etc.) of the top diode layer 320. Then, voltage is applied to the seed layer 12 and the electrolyte solution for electrodeposition of the ions of the material of the top diode layer 320 onto the second diode layer 20. The top diode layer 320 acts a diode terminal for the diode structure 330. As can be seen in view 302, the diode structure 330 includes the first diode layer 18, the second diode layer 20, and the top diode layer 320.

Referring to FIG. 3B, view 304 illustrates that the second magnetic layer 22 is deposited on top of the top diode layer 320 in the diode region 60 via electroplating. As noted above for the first magnetic layer 16 (and noted in FIG. 1), the thickness of the second magnetic layer 22 may range from 0.3 μm to 1.3 μm. Examples of the magnetic material of the second magnetic layer 22 may include NiFe, CoWP, Fe, CoFeB, etc. In a case when the second magnetic layer 22 is NiFe, the composition may be (approximately) 80% Ni and 20% Fe, the magnetic permeability of NiFe is 500 to 1000 H/m (where H is the magnetic field and m represents meter), and the resistivity of NiFe is 20 μ·Ω·cm (microOhm·centimeter). In another case when the second magnetic layer 22 is NiFe, the composition may be 45% Ni and 55% Fe, the magnetic permeability of NiFe is 200 to 700 H/m, and the resistivity of NiFe is 40 μ·Ω·cm. In the case when the second magnetic layer 22 is CoWP, the composition may be mostly Co (e.g., 75, 85, and/or 90% Co, with the remaining magnetic material as W and P), the relative magnetic permeability of CoWP is 100 to 1000 H/m, and the resistivity of CoWP is 100 μ·Ω·cm.

As seen in FIG. 3B, the diode structure 330 is in forward bias when voltage (+V) is applied to the seed layer 12 and the electrical current flows upward through the first magnetic layer 16, through first diode layer 18, through second diode layer 20, through the top diode layer 320, through second magnetic layer 22, and into subsequent layers, but not in the reverse direction.

View 306 illustrates repeatedly electroplating additional layers to form the magnetic stack with the desired layers all in forward bias. FIG. 3C illustrates the multilayer magnetic structure 300 with the desired number of layers formed in the magnetic stack in view 308. The dashed lines represent the additional number of layers deposited utilizing the fabrication operations discussed herein. The first magnetic layer 16 and second magnetic layer 22 may be the same magnetic material. To electroplate the layers in FIG. 3, the multilayer magnetic structure 300 may be moved from one tank of electrolyte solution to another tank of different electrolyte solution until the multilayer magnetic structure 300 is formed. For example, there may be one tank of electrolyte solution for depositing the first magnetic layer 16, one tank of electrolyte solution for depositing the first diode layer 18, one tank of electrolyte solution for depositing the second diode layer 20, one tank of electrolyte solution for depositing the top diode layer 320, and another (or the same the first magnetic layer 16) tank of electrolyte solution for depositing the second magnetic layer 22. Then, the electroplating process repeats to form additional layers as shown in view 306. The multilayer magnetic structure 300 is annealed to form the diodes structures 330. The multilayer magnetic structure 300 may be annealed as 220 C (Celsius).

Figure 4A:
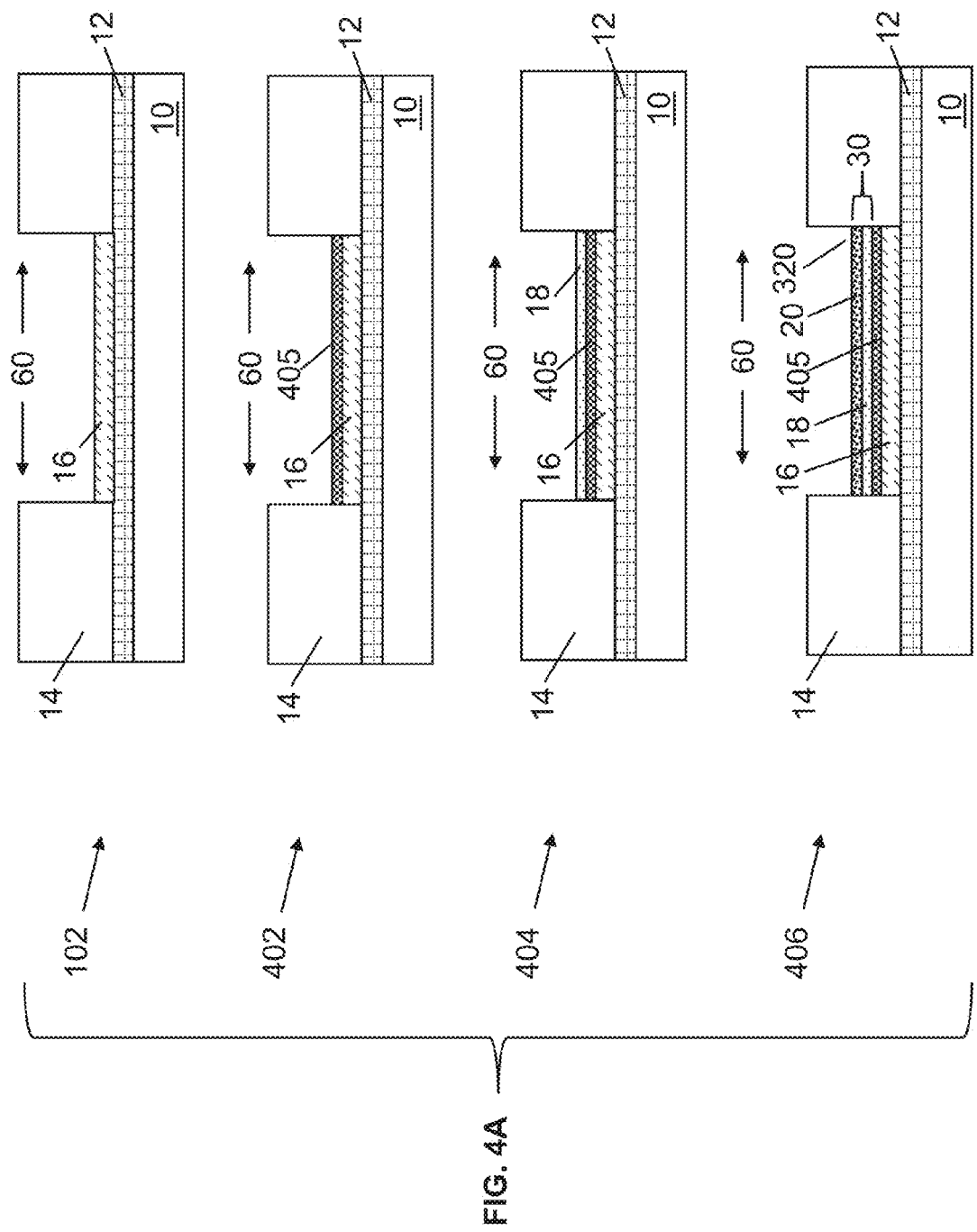
Figure 4B:
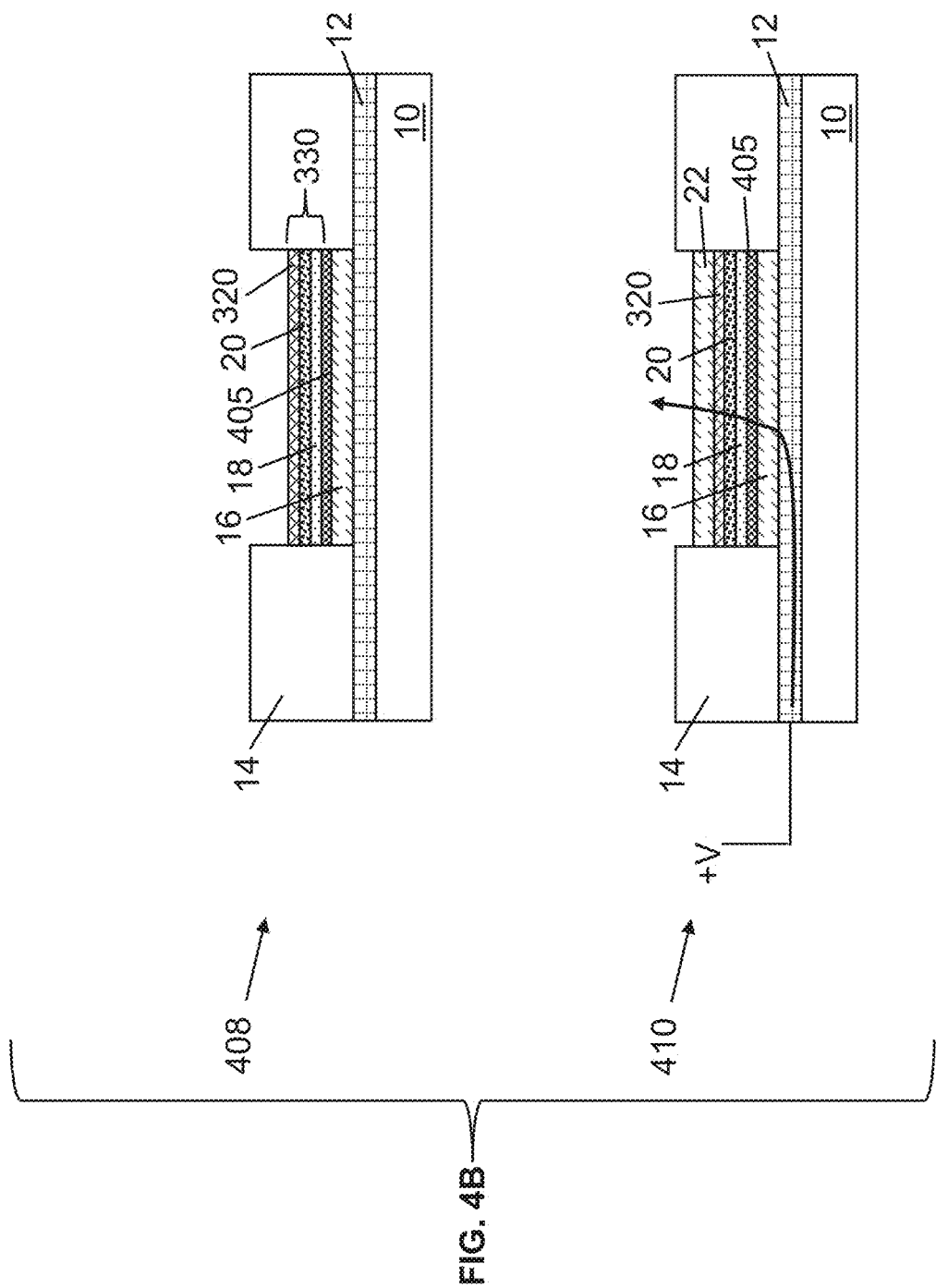
Figure 4C:
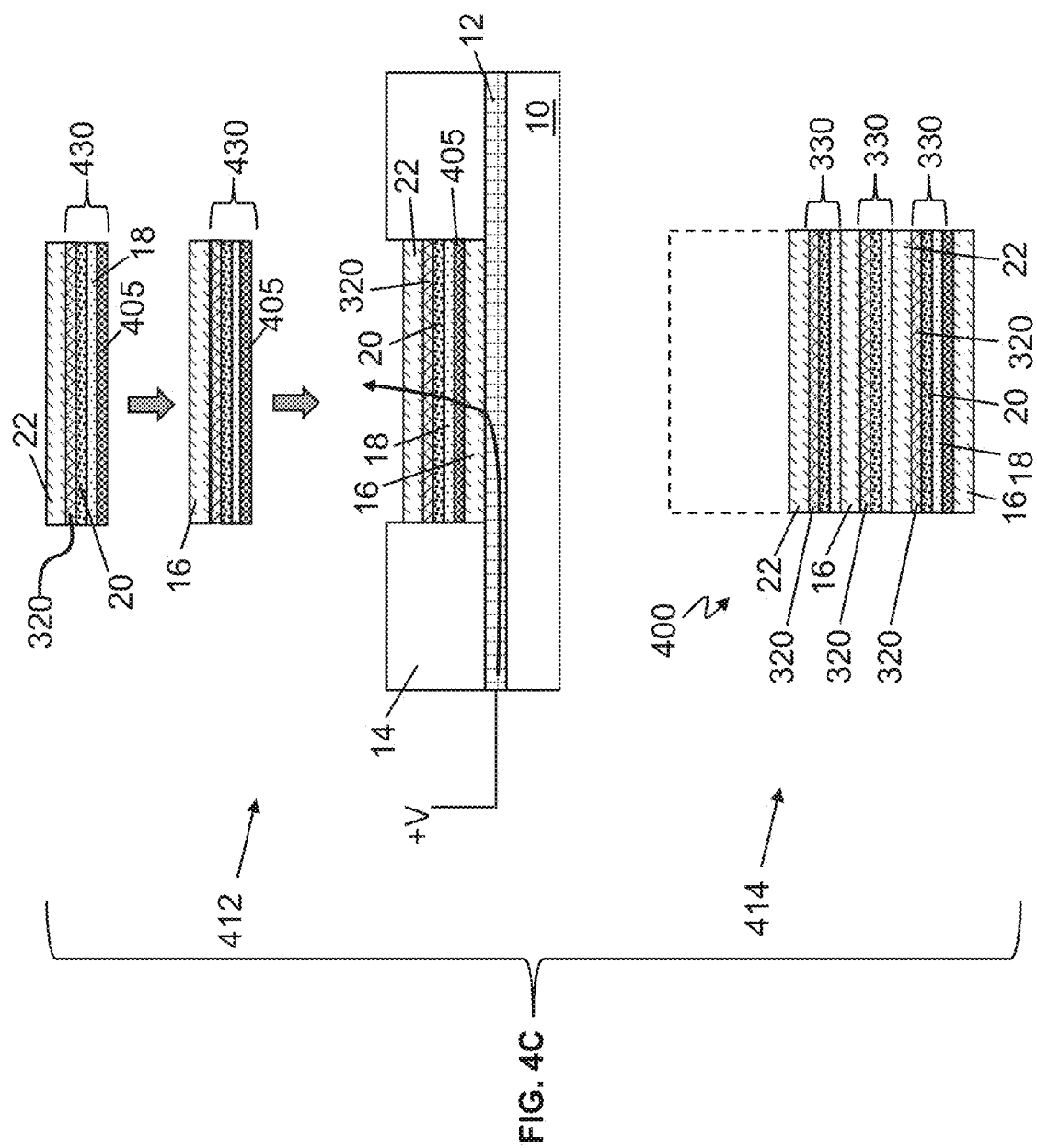

FIGS. 4A, 4B, and 4C (generally referred to a FIG. 4) illustrate a schematic to fabricate a magnetic multilayer structure 100 with a barrier layer according to an embodiment. FIGS. 4A through 4C are cross-sectional views of the schematic to form the magnetic multilayer structure 400.

In FIG. 4A, view 102 is shown again from above and the detailed discussions are not repeated again. View 102 illustrates the substrate 10 with a seed layer 12 deposited in preparation for electroplating, and the photoresist 14 is deposited and patterned on the seed layer 12 in preparation for electrodepositing subsequent layers during electroplating. Subsequent fabrication operations of the electroplating process are discussed below. In view 102, the first magnetic layer 16 of magnetic material is deposited on the seed layer 12 by electroplating.

In view 402, a barrier layer 405 is deposited on the first magnetic layer 16 in the device region 60 by electroplating. The material of the barrier layer 405 may include NiP, CoP, and/or other barrier materials. To electroplate the barrier layer 405, an electrolyte solution (NiP, CoP) has ions of the materials of barrier layer 405. The barrier layer 405 is a non-magnetic material (i.e., NiP, CoP) with a high resistance that is thermally stable, and still provides enough conducting to allow currents to flow through. The barrier layer 405 interfaced between the first magnetic layer 16 and the first diode layer 18 (subsequently deposited) prevents the first magnetic layer 16 and first diode layer 18 from reacting. The thickness of the barrier layer 405 (e.g., CoP and/or NiP) may range from 10 nm to 100 nm and may be formed by a combined cell with P in the plating solution, and pulse plating to increase the P concentration where the barrier layer 405 is desired. Also possible plated Se and a range of sputtered films such as undoped Si and Ge may be utilized.

View 402 illustrates that a first diode layer 18 is deposited on the barrier layer 405 in the device region 60 by electroplating. View 402 is analogous to view 104 except the barrier layer 405 is now added. In view 406, a second diode layer 20 is deposited on the first diode layer 18 in the device region 60 by electroplating. FIG. 4B shows that the top diode layer 320 is deposited on top of the second diode layer 20 by electroplating in view 408 (which is analogous to view 302 in FIG. 3A). The first diode layer 18, the second diode layer 20, and the top diode layer 320 all form the diode structure 330.

As noted above, the first diode layer 18 may be a p-type material (having more positive charge carriers) and the second diode layer 20 may be an n-type material (having more negative charge carriers) such that the diode structure 330 is forward biased in the upward direction (e.g., from first diode layer 18 to second diode layer 20 to the top diode layer 320) and reverse biased in the downward direction (e.g., from second diode layer 20 to first diode layer 18). The forward bias of the diode structure 330 and subsequent diode structures 330 only allows electrical current to flow upward thus blocking eddy current from flowing downward as discussed herein.

View 410 illustrates that the second magnetic layer 22 is deposited on the top diode layer 320 in the diode region 60 via electroplating. As noted above, the thickness of the first magnetic layer 16 and the second magnetic layer 22 may range from 0.3 µm to 1.3 µm.

In view 410, the diode structure 330 is in forward bias when voltage (+V) is applied to the seed layer 12 and the electrical current flows upward through the first magnetic layer 16, through barrier layer 405, through first diode layer 18, through second diode layer 20, through second magnetic layer 22, and into/through subsequent layers, but not in the reverse direction.

Referring to FIG. 4C, view 412 illustrates repeatedly electroplating additional layers to form the magnetic stack with the desired layers all in forward bias. View 414 illustrates the multilayer magnetic structure 400 with the desired number of layers formed in the magnetic stack. The dashed lines represent that additional layers have been deposited utilizing the fabrication operations discussed herein. The first magnetic layer 16 and second magnetic layer 22 may be the same magnetic material. Examples materials of the first magnetic layer 16, the first diode layer 18, the second diode layer 20, the top diode layer 320, and the second magnetic layer 22 have been discussed herein and are not repeated.

To electroplate the layers in FIG. 4, the multilayer magnetic structure 300 may be moved from one tank of electrolyte solution to another tank of different electrolyte solution until the multilayer magnetic structure 400 is formed. For example, there may be one tank of electrolyte solution for depositing the first magnetic layer 16, one tank of electrolyte solution for depositing the barrier layer 405, one tank of electrolyte solution for depositing the first diode layer 18, one tank of electrolyte solution for depositing the second diode layer 20, one tank of electrolyte solution for depositing the top diode layer 320, and another (or the same the first magnetic layer 16) tank of electrolyte solution for depositing the second magnetic layer 22. Then, the electroplating process continuously repeats to form additional layers as shown in view 412. The multilayer magnetic structure 400 is annealed to form the diodes structures 330. The multilayer magnetic structure 400 may be annealed as 220 C (Celsius).

Figure 5A:
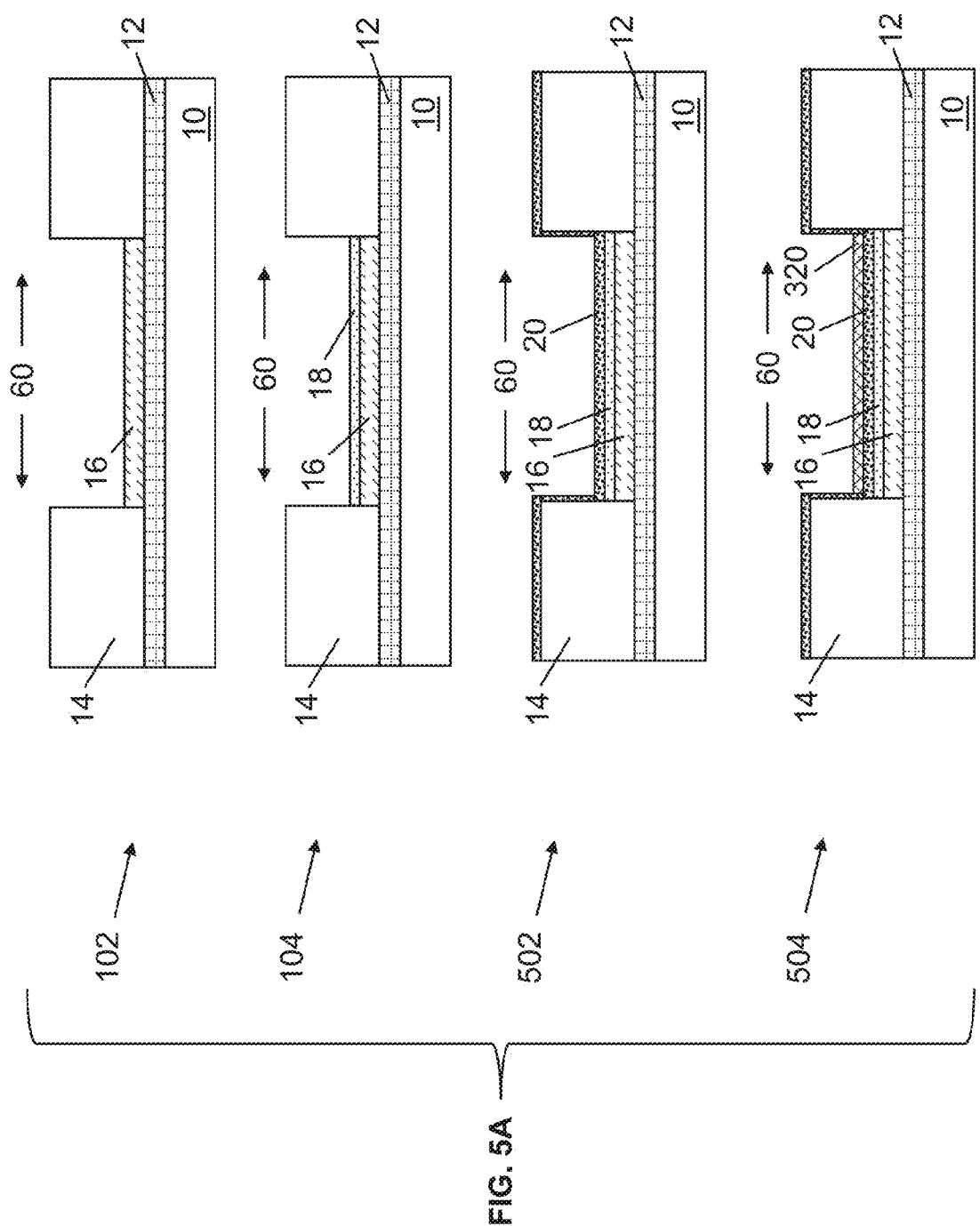
Figure 5B:
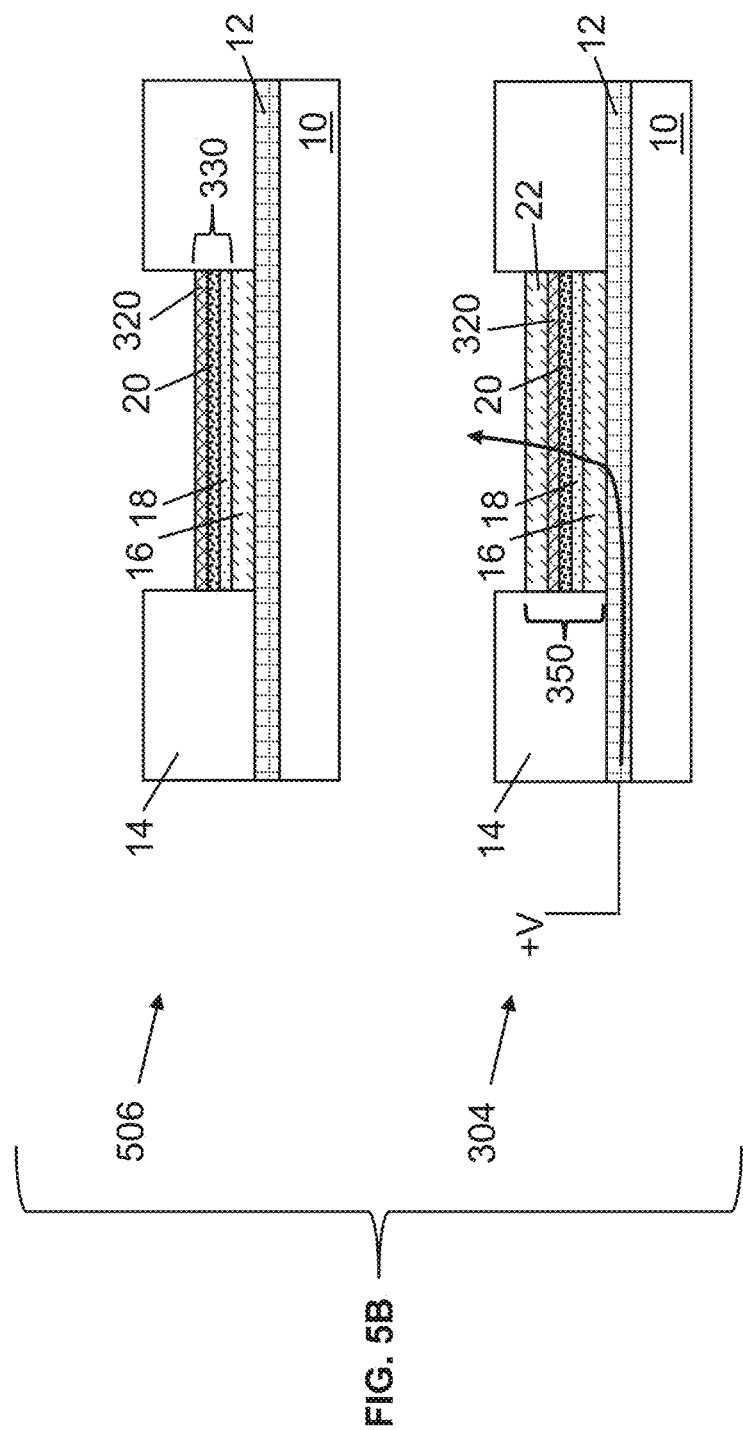
Figure 5C:
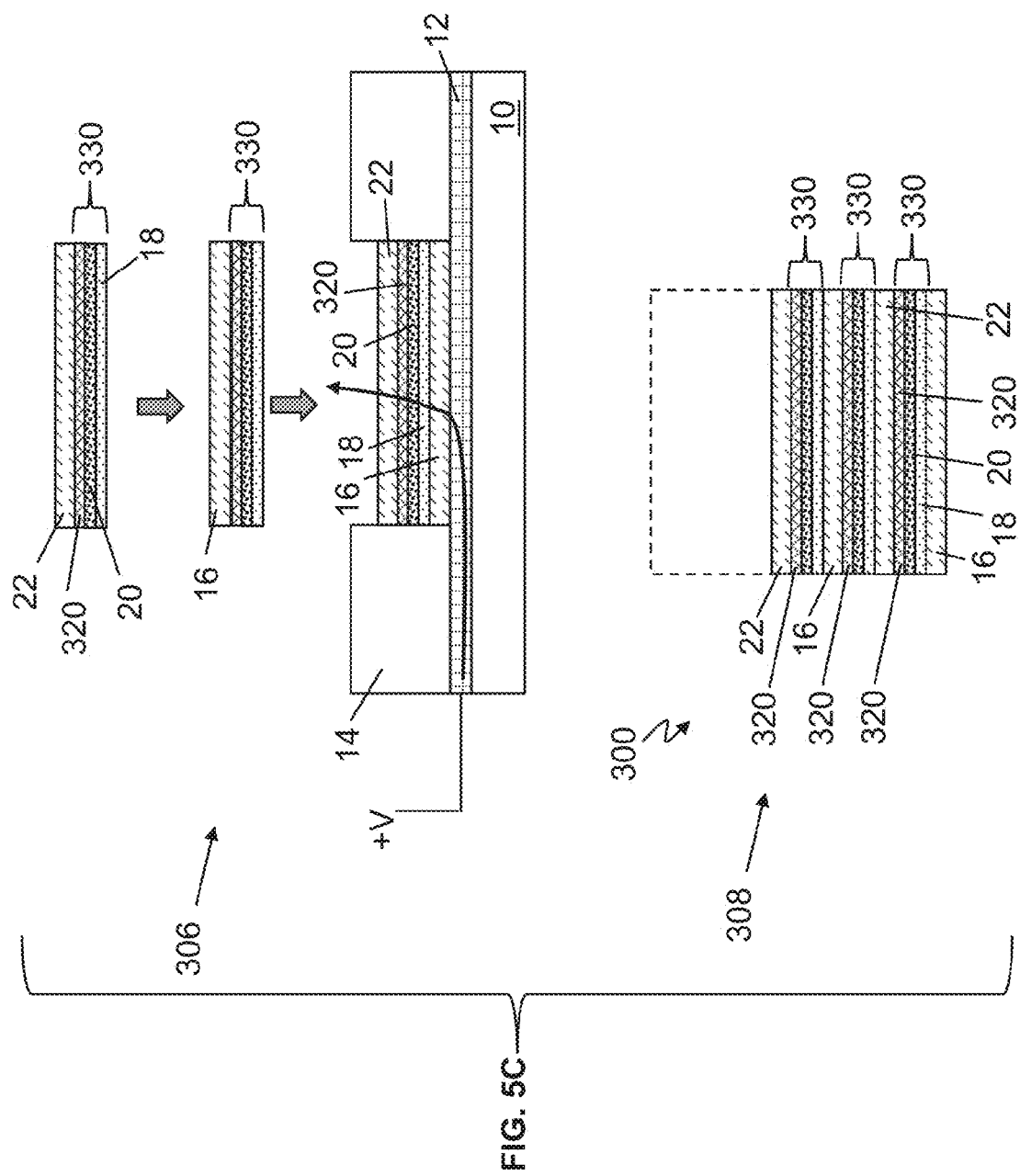

FIGS. 5A, 5B, and 5C (generally referred to a FIG. 5) illustrate a schematic to fabricate the magnetic multilayer structure 400 according to an embodiment. FIGS. 5A through 5C are cross-sectional views of the schematic to form the magnetic multilayer structure 400 by using other deposition techniques, e.g., other than and/or in addition to electroplating, for some diode layers in the magnetic multilayer structure 400.

FIG. 5A illustrates the fabrication processes in views 102 and 104 previously discussed herein. As noted above, the seed layer 12 is deposited on the substrate 10 and the photoresist 14 is deposited and patterned on the seed layer 12 in preparation for depositing subsequent layers. The first magnetic layer 16 of magnetic material is deposited on the seed layer 12 by electroplating. In view 104, a first diode layer 18 is deposited on the first magnetic layer 16 in the device region 60 by electroplating. The first diode layer 18 may also be deposited by other deposition techniques such as sputtering, and the material of the first diode layer 18 may include Al, Ta, and Ga (when sputtered).

View 502 illustrates sputtering the second diode layer 20 on top of both the first diode layer 18 and the photoresist 14. The second diode layer 20 may be a semiconductor material. The material of the second diode layer 20 may include Si, Ge, Se, etc.

View 504 illustrates that the top diode layer 320 is deposited on top of the second diode layer 20 in the device region 60 by electroplating. The top diode layer 320 may also be deposited utilizing other deposition techniques. In FIG. 5B, view 506 illustrates that a wet etchant has been utilized to etch off the excess semiconductor material of the sputtered second diode layer 20. The excess semiconductor material of the sputtered second diode layer 20 was located on the resist 14. The first diode layer 18, the second diode layer 20, and the top diode layer 320 all form the diode structure 330.

FIG. 5B also shows the view 304 which illustrates that the second magnetic layer 22 is deposited on top of the top diode layer 320 in the diode region 60 via electroplating. As noted above, the first magnetic layer 16 and the second magnetic layer 22 may each have a thickness in the range from 0.3 µm to 1.3 µm. The diode structure 330 is in forward bias when voltage (+V) is applied to the seed layer 12 and the electrical current flows upward through the first magnetic layer 16, through first diode layer 18, through second diode layer 20, through second magnetic layer 22, and into subsequent layers, but not in the reverse direction (as discussed in FIG. 3B).

FIG. 5C also includes views 306 and 308 discussed above in FIG. 3. View 306 illustrates repeatedly depositing additional layers to form the magnetic stack with the desired layers all in forward bias. FIG. 5C illustrates the multilayer magnetic structure 300 with the desired number of layers formed in the magnetic stack in view 308. Again, the dashed lines denote that additional layers have been deposited utilizing the fabrication operations discussed herein. The first magnetic layer 16 and second magnetic layer 22 may be the same magnetic material. The multilayer magnetic structure 300 may be annealed at 220° C. to form the diodes structures 30.

Figure 6:
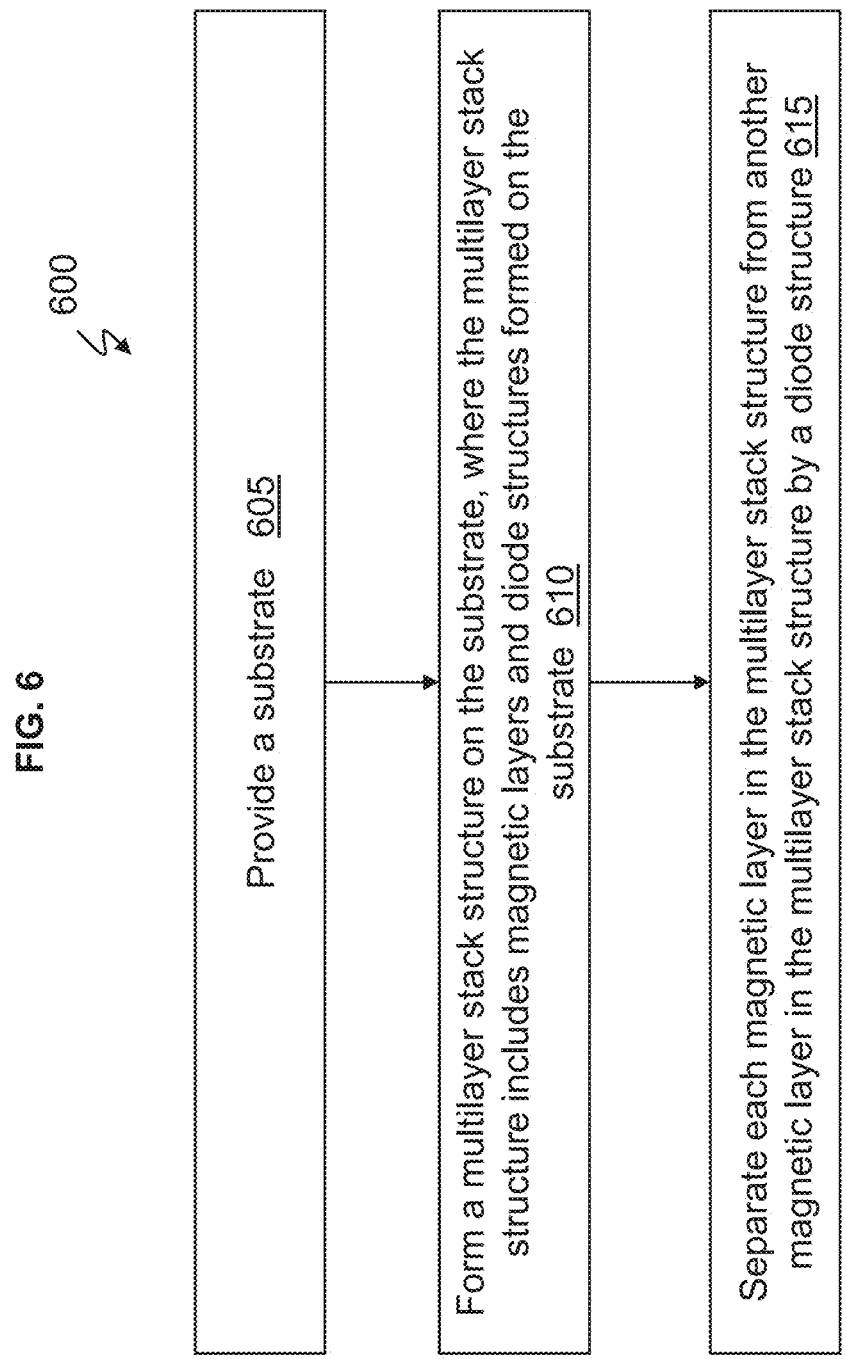
FIG. 6 illustrates a method for fabricating an integrated laminated magnetic device according to an embodiment.

FIG. 6 illustrates a method 600 for fabricating an integrated laminated magnetic device (i.e., multilayer magnetic structures 100, 300, 400) according to an embodiment.

The substrate 10 is provided at block 605. A multilayer stack structure is formed on the substrate 10, in which the multilayer stack structure includes magnetic layers 16, 22 and diode structures 30, 330 formed on the substrate 10 at block 610.

At block 615, each magnetic layer 16 in the multilayer stack structure is separated from another magnetic layer 22 in the multilayer stack structure by a diode structure 30, 330.

The multilayer stack structure comprises repeated sandwiches of two of the magnetic layers 16 and 22 having the diode structure 30, 330 interposed in between. The sandwich of the magnetic layer 16, the diode structure 30, 330, and the other magnetic layer 22 repeats until the multilayer stack structure is formed of multiple sandwiches (shown as multilayer magnetic structures 100, 300, 400).

The magnetic layers are disposed to form the multilayer stack structure by electroplating. The (first diode layers 18, second diode layer 20, top diode layers 320 of the) diode structures 30, 330 are disposed to form the multilayer stack structure by electroplating.

The diode structures 30, 330 are forwarded bias in a same direction in the multilayer stack structure, such that the same direction is a forward bias direction. An electrical eddy current in the multilayer stack structure is inhibited from flowing in a reverse bias direction between the each magnetic layer and the other magnetic layer (as shown in FIG. 2).

The diode structures 30, 330 in the multilayer structure each comprise a p-type material having positive charge carriers and an n-type material having negative charge carriers.

FIG. 7 illustrates a method 700 for fabricating an integrated laminated magnetic device (i.e., multilayer magnetic structures 100, 300, 400) according to an embodiment.

A seed layer 12 is formed on a substrate 10 at block 705. A mask structure (e.g., patterned photoresist 14) is formed over the seed layer 12, in which the mask structure exposes an exposed portion of the seed layer 12 that defines a device region 60 at block 710. Electroplating deposits a first magnetic layer 16 on the exposed portion of the seed layer 12 within the device region 60 using the seed layer 12 as an electrical cathode or anode (e.g., the seed layer 12 is connected to the negative or positive terminal of the voltage source) at block 715.

A diode structure 30, 330 (e.g., of the first diode layer 18, the second diode layer 20, and optionally the top diode layer 320) is formed on the first magnetic layer 16 in the device region 60 at block 720. Optionally, the barrier layer 405 may be deposited on the first magnetic layer 16 before the depositing the diode structure 30, 330. Electroplating deposits a second magnetic layer 22 on the diode structure 30, 330 within the device region 60 using the seed layer 12 as the electrical cathode or anode at block 725.

The first magnetic layer 16 is electrically connected to the second magnetic layer 22 by the diode structure 30, 330 being in a forward bias direction at block 730. The combination of the first magnetic layer, the diode structure, and the second magnetic layer form a sandwich.

A multilayer stack structure is constructed of multiple sandwiches having multiple first magnetic layers 16, multiple second magnetic layers 22, and multiple diode structures 30, 330. One of the multiple diode structures is interposed between one of the multiple first magnetic layers 16 and one of the multiple second magnetic layers 22.

The multiple diode structures are forwarded bias in a same direction in the multilayer stack structure, such that an electrical eddy current in the multilayer stack structure is inhibited from flowing in a reverse bias direction between each of the multiple first magnetic layers and the multiple second magnetic layers.

For illustration purposes, various deposition techniques are discussed below and can be utilized in embodiments, as understood by one of ordinary skill in the art. Thin film deposition is the act of applying a thin film to a surface which is any technique for depositing a thin film of material onto a substrate or onto previously deposited layers. Thin is a relative term, but most deposition techniques control layer thickness within a few tens of nanometers. Molecular beam epitaxy allows a single layer of atoms to be deposited at a time. Deposition techniques fall into two broad categories, depending on whether the process is primarily chemical or physical. Chemical vapor deposition utilizes a fluid precursor that undergoes a chemical change at a solid surface, leaving a solid layer. Chemical deposition is further categorized by the phase of the precursor and examples of chemical deposition include, but are not limited to: plating; chemical solution deposition (CSD) or chemical bath deposition (CBD); spin coating or spin casting; chemical vapor deposition (CVD); plasma enhanced CVD (PECVD); atomic layer deposition (ALD); and so forth.

Physical vapor deposition (PVD) uses mechanical, electromechanical, or thermodynamic means to produce a thin film of solid. Examples of physical deposition include but are not limited to: a thermal evaporator (i.e., molecular beam epitaxy); an electron beam evaporator; sputtering; pulsed laser deposition; cathodic arc physical vapor deposition (arc-PVD); electrohydrodynamic deposition (electrospray deposition); reactive PVD; and so forth.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated laminated magnetic device, comprising:
a substrate; and
a multilayer stack structure which includes alternating magnetic layers and diode structures formed on the substrate;
wherein each magnetic layer in the multilayer stack structure is separated from another magnetic layer in the multilayer stack structure by a diode structure.

2. The device of claim 1, wherein the multilayer stack structure comprises repeated sandwiches of two of the magnetic layers having the diode structure interposed in between.

3. The device of claim 1, wherein a sandwich of the magnetic layer, the diode structure, and the another magnetic layer repeats until the multilayer stack structure is formed of multiple sandwiches.

4. The device of claim 1, wherein the magnetic layers are disposed to form the multilayer stack structure by electroplating.

5. The device of claim 1, wherein the diode structures are disposed to form the multilayer stack structure by electroplating.

6. The device of claim 1, wherein the diode structures are forwarded bias in a same direction in the multilayer stack structure.

7. The device of claim 6, wherein the same direction is a forward bias direction.

8. The device of claim 7, wherein an electrical eddy current in the multilayer stack structure is inhibited from flowing in a reverse bias direction between the each magnetic layer and the another magnetic layer.

9. The device of claim 6, wherein the diode structures in the multilayer stack structure each comprise a p-type material having positive charge carriers and an n-type material having negative charge carriers.

10. The device of claim 1, wherein each of the alternating magnetic layers has a thickness of about 0.3 micrometers (μm) to 1.3 μm.

11. The device of claim 1, wherein the alternating magnetic layers include magnetic material.

12. The device of claim 11, wherein the magnetic material is NiFe.

13. The device of claim 11, wherein the magnetic material is selected from the group consisting of NiFe, CoWB, Fe, CoFeB, CoWP, CoP, and NiFeCo.

14. The device of claim 11, wherein the magnetic material is composition of about 80% Ni and 20% Fe to form NiFe.

15. The device of claim 14, wherein a magnetic permeability of NiFe is 500 to 1000 H/m.

16. The device of claim 15, wherein a resistivity of NiFe is about 20 μ·Ω·cm.

17. The device of claim 11, wherein the magnetic material is composition of about 45% Ni and 55% Fe to form NiFe.

18. The device of claim 17, wherein a magnetic permeability of NiFe is 200 to 700 H/m.

19. The device of claim 18, wherein the resistivity of NiFe is about 40 μ·Ω·cm.

20. The device of claim 11, wherein the magnetic material is CoWP;
wherein a composition CoWB is majority Co such that a magnetic permeability I about 100 to 1000 H/m.

* * * * *